United States Patent
Chao et al.

(10) Patent No.: US 8,499,274 B2
(45) Date of Patent: Jul. 30, 2013

(54) COMPUTER IMPLEMENTED SYSTEM AND METHOD FOR LEAKAGE CALCULATION

(75) Inventors: Chien-Ju Chao, New Taipei (TW);
Jerry Chang-Jui Kao, Taipei (TW);
King-Ho Tam, Hsinchu (TW);
Chung-Hsing Wang, Baoshan Township, Hsinchu County (TW); Huan Chi Tseng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/403,289

(22) Filed: Feb. 23, 2012

(65) Prior Publication Data

US 2013/0139120 A1 May 30, 2013

Related U.S. Application Data

(60) Provisional application No. 61/564,937, filed on Nov. 30, 2011.

(51) Int. Cl.
*G06F 17/50* (2006.01)
*G06F 9/455* (2006.01)
*G06G 7/48* (2006.01)

(52) U.S. Cl.
USPC ........... 716/133; 716/134; 716/136; 716/111; 716/113; 703/4

(58) Field of Classification Search
None
See application file for complete search history.

(56) References Cited

U.S. PATENT DOCUMENTS

| | | | |
|---|---|---|---|
| 7,268,590 B2* | 9/2007 | Kao et al. | 326/95 |
| 7,814,339 B2 | 10/2010 | Monferrer et al. | |
| 8,069,432 B2* | 11/2011 | Zhang et al. | 716/136 |
| 8,086,978 B2* | 12/2011 | Zhang et al. | 716/109 |
| 8,181,144 B2* | 5/2012 | Tetelbaum | 716/134 |
| 8,185,865 B2* | 5/2012 | Gupta et al. | 716/139 |
| 2007/0152745 A1* | 7/2007 | Hou et al. | 327/544 |
| 2009/0031268 A1* | 1/2009 | Miranda et al. | 716/6 |
| 2009/0319969 A1* | 12/2009 | Zhang et al. | 716/5 |
| 2010/0131249 A1* | 5/2010 | Homma | 703/2 |
| 2011/0082680 A1* | 4/2011 | Chang et al. | 703/14 |
| 2012/0210284 A1* | 8/2012 | Datta et al. | 716/112 |

* cited by examiner

*Primary Examiner* — A. M. Thompson
(74) *Attorney, Agent, or Firm* — Duane Morris LLP; Steven E. Koffs (57) ABSTRACT

A tool includes one or more machine readable storage mediums encoded with data. The data include a list of standard cells included in an integrated circuit (IC) design The data include a nominal leakage value approximating a respective median leakage value for each of the plurality of standard cells at a predetermined temperature and voltage. The data include at least one table including adjustment factors for calculating leakage based on voltage, temperature and process variations. The table includes a respective statistical scaling factor, for computing a mean leakage corresponding to a given median leakage. A processor is programmed to calculate and output a total IC leakage for the IC design at an input voltage and input temperature, based on the list, the nominal leakage values, the input voltage, the input temperature and at least one of the adjustment factors.

20 Claims, 7 Drawing Sheets

```
Library_name(std_lib
operating_voltage = 1.2V;
operating_temperature = 25C;
...
library_leakage_scaling_factor(
    temperature_index (-40, 25, 85, 125);
    voltage_index (1.0, 1.2, 1.4);
    table_content (  \
        -0.20,  -0.10,  0.50,  1.50,  \
        -0.18,   0.20,  0.55,  2.00,  \
         0.20,   0.90,  1.50,  3.00
    )
)
```

```
Library_name(std_lib
    operating_voltage = 1.2V;
    operating_temperature = 25C;
    ...
    gate (AN2D4
        ...
        leakage(
            state = A1&!A2;
            value = 1.234;
        )
        ...
    cell_leakage_scaling_factor(
        temperature_index (-40, 25, 85, 125);
        voltage_index (0.9, 1.0, 1.2);
        table_content (
            -0.20, -0.10,  0.50,  1.50, \
            -0.18,  0.20,  0.55,  2.00, \
             0.20,  0.90,  1.50,  3.00
        )
    )
  )
 )
)
```

COMPUTER IMPLEMENTED SYSTEM AND METHOD FOR LEAKAGE CALCULATION

This application claims the benefit of U.S. Provisional Patent Application No. 61/564,937, filed Nov. 30, 2011, which is incorporated by reference herein in its entirety.

FIELD

The present disclosure relates to automated tools used in the integrated circuit design process.

BACKGROUND

The semiconductor fabrication industry continues to increase integrated circuit (IC) design density, reduce device sizes and reduce power consumption. Parasitic losses continue to be an area of concern.

A major component of leakage power includes the power consumed by transistors when they are not actively switching. IC designers seek to improve the leakage power consumption of an IC without impacting its performance characteristics. In a modern IC design, pre-designed standard-cell libraries are used to provide the components from which an IC is synthesized and optimized. The leakage power consumption and the performance characteristics of the IC depend on the standard-cell library used.

Various IC designers may choose to optimize their products for particular applications. A designer may wish to qualify its IC under different temperature and voltage conditions than those used to characterize the standard cell library.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The inventors have determined that, although corner based leakage characterization of cells and macros may be used, a typical corner (nominal leakage specification) is overly optimistic, and the highest performance corner (high leakage specification) is overly conservative for the purpose of leakage power estimation.

Figure 4:
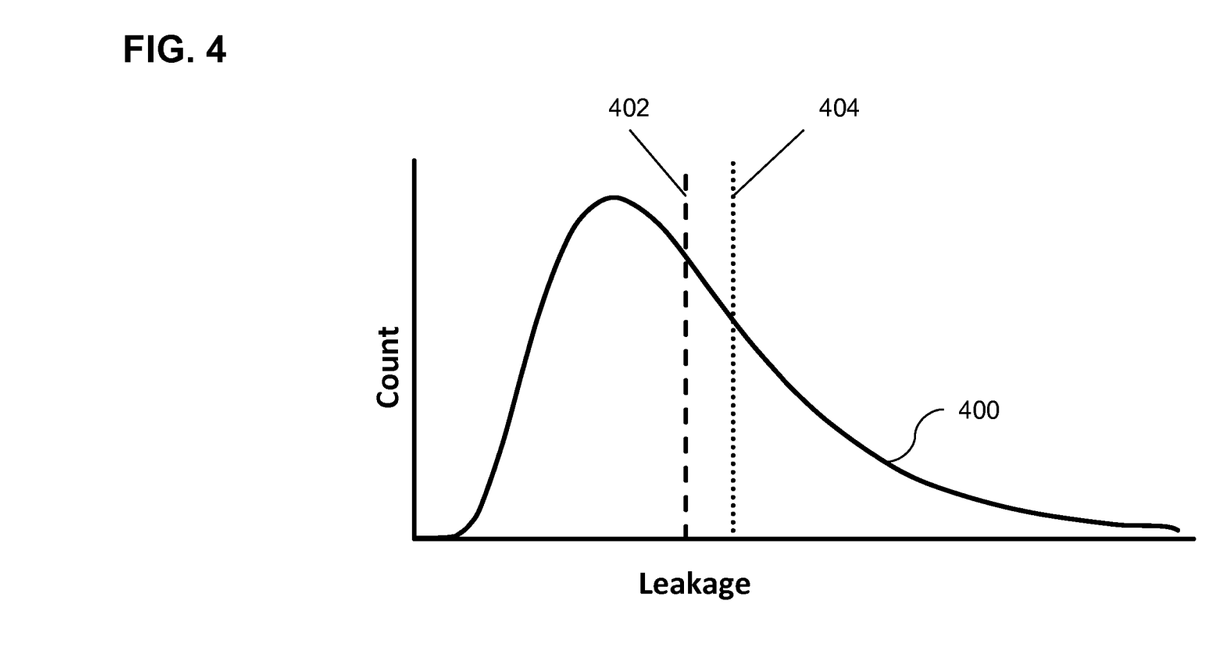
FIG. 4 is a diagram showing the leakage distribution across many instantiations of a cell in an IC in accordance with an embodiment of the invention.

The inventors have also determined that the statistical variations in leakage across the large number of devices in an IC is not considered in the corner approach to leakage estimation. For example, FIG. 4 is a diagram showing a leakage distribution 400 for a large number of instances of a complementary metal oxide semiconductor (CMOS) transistor across an IC. In any given CMOS IC, the leakages for the individual transistors are distributed according to a distribution similar to a log-normal distribution. When there is a single source of variation that dominates leakage behavior, the nominal leakage 402 for such a distribution approximates the median. However, the mean leakage value 404 for a log-normal distribution tends to be larger than the nominal leakage. Thus, the mean leakage of a CMOS transistor across an IC is larger than the nominal leakage. A similar difference exists between nominal and mean leakage for an NMOS or PMOS device, and under more than one source of variation.

The inventors have also found that the mean leakage is an effective measure for the designer to determine the total IC leakage. Whereas ensuring system performance is based on performing timing analysis based on extreme corner performance for devices, the total IC leakage can be estimated well from the average (mean) device leakage, without impact on timing performance.

Based on these findings, the inventors have developed a computer implemented model for IC leakage calculation which considers multiple power (Vdd) and temperature operating conditions and spans a large process-voltage-temperature (PVT) space. This model further recognizes the statistical impact of the leakage variations within an IC.

Using this tool, designers can select their own PVT conditions for leakage signoff, regardless of the PVT conditions used during characterization of the cells and macros in the standard cell library. This tool can be achieved without requiring the standard cell library developer or foundry to pre-characterize every library, and without requiring the designers to obtain expensive characterization tools.

Figure 1:
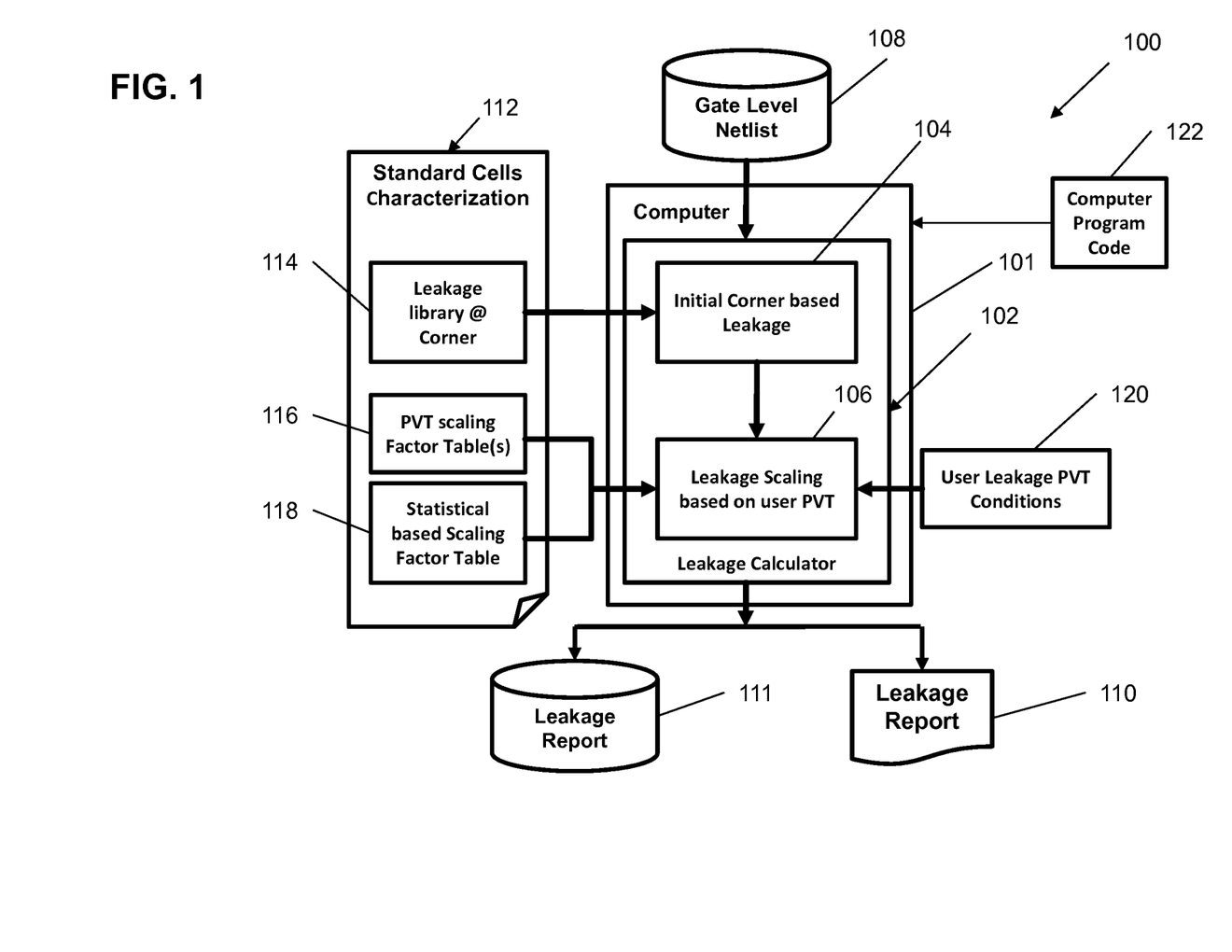
FIG. 1 is a block diagram of a computer implemented tool for calculating IC leakage.

FIG. 1 is a block diagram of an example of a tool 100.

The tool 100 includes a processor 101. In some embodiments, the processor 101 is a general purpose processor programmed to form a special purpose processor. The general purpose processor may be a computer, a tablet computer, or other electronic device having an embedded programmable processor.

The tool 100 includes one or more machine readable storage mediums 108, 112, 120, 122 encoded with data. For ease of illustration, various blocks are illustrated in FIG. 1. These blocks do not necessarily correspond one-to-one to specific media. For example, The gate level netlist 108, leakage library 114, PVT scaling table 116, statistical scaling table 118, leakage report 111, user leakage PVT conditions 120 and computer program code 122 may all be stored in a single medium, or each of these data may be stored in a separate medium. If more than one medium is included, the media may be of the same type, or of any combination of two or more machine readable storage media. Further, data illustrated as a single block in FIG. 1 may actually be striped or otherwise distributed among two or more distinct physical storage devices.

A set of computer program code 122 contains instructions for calculating IC leakage. Computer program code 122 is encoded in a persistent machine readable storage medium, such that when a processor executes the computer program code, the processor performs a method discussed below.

The gate level netlist 108 provides a list of a plurality of standard cells and/or macros included in an integrated circuit (IC) design. In some embodiments, the gate level netlist is provided by an electronic design automation (EDA) tool, such as "IC COMPILER"™, sold by Synopsis, Inc. of Mountain View, Calif., which may include a place and route tool 304, such as "ZROUTE"™, also sold by Synopsis. Other EDA tools 302 may be used, such as the "VIRTUOSO" custom design platform or the Cadence "ENCOUNTER"® digital IC design platform may be used, along with the "NANOROUTE"™ chip assembly router 304, all sold by Cadence Design Systems, Inc. of San Jose, Calif.

A set of standard cell characterization data 112 are provided. For example, the vendor of a standard cell library may provide the standard cell characterization data. These data include a plurality of components.

A set of nominal leakage values 114 are provided for each of the plurality of standard cells at a predetermined temperature and voltage corresponding to the nominal operating process corner.

A step of PVT scaling data are provided. The PVT scaling data may be provided in a variety of forms. In the embodiment of FIG. 1, a first set of data provides PVT scaling factors 116, and a second set of data provides a statistical based scaling factor 118. In some embodiments, the PVT scaling factors 116 are implemented in at least one table including adjustment factors for calculating leakage based on voltage, temperature and process variations.

For example, in some embodiments, the at least one table includes two or more voltage-temperature scaling tables, each table containing scaling factors for each of a set of temperature-voltage combinations at a single process corner. Each process corner is represented by a respective voltage-temperature scaling table. This representation is convenient for computer implemented two-dimensional (2-D) interpolation among various voltage and temperature conditions. The inventors have determined that it is possible to design the 2-D table such that scaling factors can be smoothly and accurately interpolated by linear or higher-order interpolation methods, where denser grids of voltage and temperature can be applied for scaling factors more sensitive to V-T variation. On the other hand, there is no interpolate-able continuity between process corners, so a fast-running estimation is provided by accessing a respectively different voltage-temperature scaling table for each respective process corner.

The characterization data 112 further includes a statistical scaling table 118 including a respective statistical scaling factor for each cell and/or macro, for computing a mean leakage corresponding to a given nominal leakage. Given an identification of a standard cell and its nominal leakage, this table provides a factor which can be used to determine the mean leakage, as discussed above with reference to FIG. 4.

In some embodiments, the PVT scaling factors 116 and the statistical factors 118 are distinct factors stored in separate tables. Given a nominal leakage, process corner, input temperature and input voltage, the median leakage can be calculated using the PVT scaling factors 116, and the mean leakage can then be calculating from the median leakage and the corresponding statistical factor 118.

Figure 6:
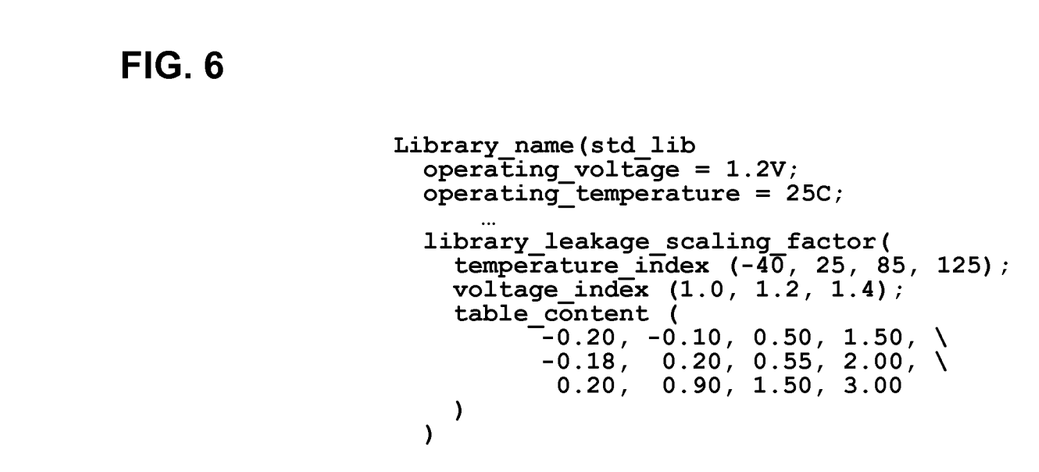
FIG. 6 is an example of a library based scaling factor table in accordance with an embodiment of the invention.

In other embodiments (e.g., as shown in FIG. 6), the PVT scaling factors and statistical based scaling factor are merged into a single table. For example, all of the PVT scaling factors for a given cell can be scalar multiplied by the corresponding statistical based scaling factor for that cell and stored in a single table. Within the table, each adjustment factor includes a component for causing the processor to calculate the total IC leakage using a respective mean leakage corresponding to a respective one of the nominal leakage values for each standard cell. Using such a table, the mean leakage can be calculated directly using a nominal leakage, process corner, input temperature and input voltage.

The processor 101 is programmed to calculate and output a total IC leakage for the IC design at an input voltage, an input temperature, based on the list, the nominal leakage values, the input voltage, the input temperature and at least one of the adjustment factors.

In the embodiment of FIG. 1, the leakage calculator 102 receives the initial corner based (nominal) leakage 104 from the leakage library 114. A leakage scaling function 106 receives the nominal leakage 104, and also receives the user's input PVT conditions 120 for which the IC leakage is to be estimated.

The leakage scaling function 106 performs interpolation between values in one of the voltage-temperature scaling tables 116 for at least one of an intermediate temperature value between temperatures represented in the table and an intermediate voltage value between the voltages represented in the table.

The leakage calculator outputs a leakage report, which may be printed as a hardcopy 110, or stored in a computer readable storage medium 111.

Figure 2:
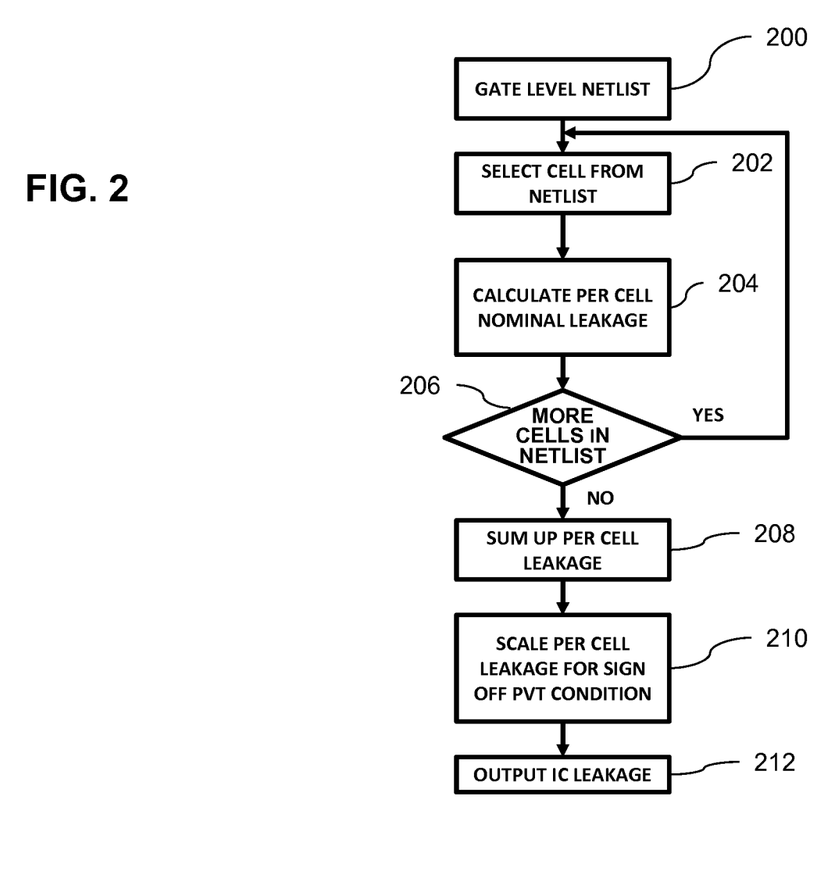
FIG. 2 is a flow chart of an embodiment of a library-based method performed by the tool of FIG. 1.

FIG. 2 shows an example of a computer implemented method performed by the tool of FIG. 1, using a library based statistical adjustment. In this variation, the statistical variations are handled at the library level by applying a statistical factor adjustment to the total IC leakage estimate. This variation provides faster computation, and will yield similar results to the cell based statistical adjustment if the ratio of mean leakage to median leakage does not vary greatly among different types of standard cells in the library.

At step 200, a list 108 (e.g., a gate level netlist) of a plurality of standard cells included in an integrated circuit (IC) design are input to a processor 101. The list 108 is stored in one or more machine readable storage mediums.

Steps 202-206 form a loop that is repeated for each respective cell in the IC design.

At step 202, a nominal leakage value is input to the processor for a selected one of the plurality of standard cells at a predetermined temperature and voltage. The identification of the cell is stored in the one or more machine readable storage mediums and retrieved therefrom. At the same time, the processor accesses at least one table including adjustment factors for calculating leakage based on voltage, temperature and process variations. In some embodiments, the adjustment factors are included in separate tables for PVT adjustment and statistical based scaling. In other embodiments, the statistical scaling factor for each respective cell is incorporated into the PVT table.

At step 204, the processor calculates the per cell leakage for the selected cell at the selected PVT conditions for which the user wishes to qualify the IC design. In some embodiments, this calculation takes into account the PVT variations, but not the statistical variation between the nominal (median) leakage and mean leakage. In some embodiments, the at least one table includes a plurality of voltage-temperature scaling tables, each containing scaling factors for each of a set of temperature-voltage combinations corresponding to a single process corner.

In some embodiments, step 204 performs interpolation between values within one of the voltage-temperature scaling tables for at least one of an intermediate temperature value between temperatures represented in the table and an intermediate voltage value between voltages represented in the table.

At step 206, if there are more cells in the netlist 108, steps 202 and 204 are repeated.

At step 208, the individual nominal (median) leakages for netlist are summed up for the selected PVT conditions for which the user wishes to qualify the IC design.

At step 210, the total nominal leakage is scaled up by an average ratio of the mean leakage to the sum of nominal (median) leakages calculated in step 208. This average ratio may be determined using a weighted factor based on the number of instances of each cell in a representative die or representative group of dies. Alternatively, the average ratio may be estimated by taking the simple arithmetic mean, median or mode of the ratio between mean cell leakage and nominal cell leakage.

The processor has now calculated a total IC leakage for the IC design at an input voltage and input temperature, based on the list, the nominal leakage values, the input voltage, the input temperature and at least one of the adjustment factors.

At step 212, The processor outputs the total IC leakage from the processor to a hardcopy 110 and/or machine readable storage medium 111. In some embodiments, the processor 101 outputs a detailed list of the leakage component contributed by each of the cells and/or macros in the IC design.

Figure 3:
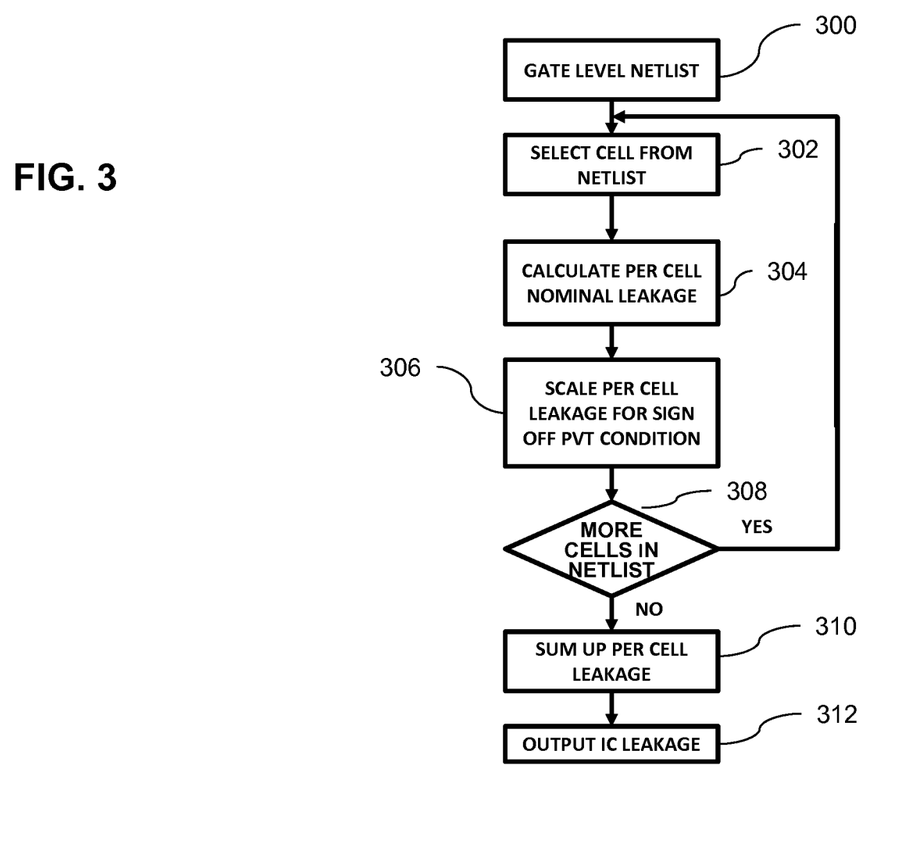
FIG. 3 is a flow chart of an embodiment of a cell-based method performed by the tool of FIG. 1.

FIG. 3 shows an example of a computer implemented method performed by the tool of FIG. 1, using a cell based statistical adjustment. In this variation, the statistical variations are handled at the cell level by applying a respectively different statistical factor adjustment to each standard cell. This variation provides more accurate results if there is substantial variation among cells in the standard cells in the library with respect to the ratio of mean leakage to median leakage.

At step 300, a list 108 (e.g., a gate level netlist) of a plurality of standard cells included in an integrated circuit (IC) design are input to a processor 101. The list 108 is stored in one or more machine readable storage mediums.

Steps 302-308 form a loop that is repeated for each respective cell in the IC design.

At step 302, a nominal leakage value is input to the processor for a selected one of the plurality of standard cells at a predetermined temperature and voltage. The identification of the cell is stored in the one or more machine readable storage mediums and retrieved therefrom. At the same time, the processor accesses at least one table including adjustment factors for calculating leakage based on voltage, temperature and process variations.

At step 304, the processor calculates the per cell leakage for the selected cell at the selected PVT conditions for which the user wishes to qualify the IC design. In some embodiments, this calculation takes into account the PVT variations, but not the statistical variation between the nominal (median) leakage and mean leakage. In some embodiments, the at least one table includes a plurality of voltage-temperature scaling tables, each containing scaling factors for each of a set of temperature-voltage combinations corresponding to a single process corner.

In some embodiments, step 304 performs interpolation between values within one of the voltage-temperature scaling tables for at least one of an intermediate temperature value between temperatures represented in the table and an intermediate voltage value between voltages represented in the table.

At step 306, the interpolated nominal leakage is scaled up by the ratio of the mean leakage to the nominal (median) leakage for the selected cell. In some standard cell libraries, this ratio is different for each respective standard cell. The at least one table 116, 118 includes a statistical scaling table 118 distinct from the voltage-temperature scaling tables 116. The statistical scaling table 118 includes a respective statistical scaling factor for each cell. The respective scaling factor to the nominal leakage value for each cell is applied, to calculate a mean leakage value for each cell. The result is a mean leakage for each cell.

At step 308, if there are more cells in the netlist 108, steps 302-306 are repeated.

At step 310, the individual mean leakages for the netlist are summed up for the selected PVT conditions for which the user wishes to qualify the IC design.

The processor has now calculated a total IC leakage for the IC design at an input voltage and input temperature, based on the list, the nominal leakage values, the input voltage, the input temperature and at least one of the adjustment factors.

At step 312, The processor outputs the total IC leakage from the processor to a hardcopy 110 and/or machine readable storage medium 111. In some embodiments, the processor 101 outputs a detailed list of the leakage component contributed by each of the cells and/or macros in the IC design.

Figure 5:
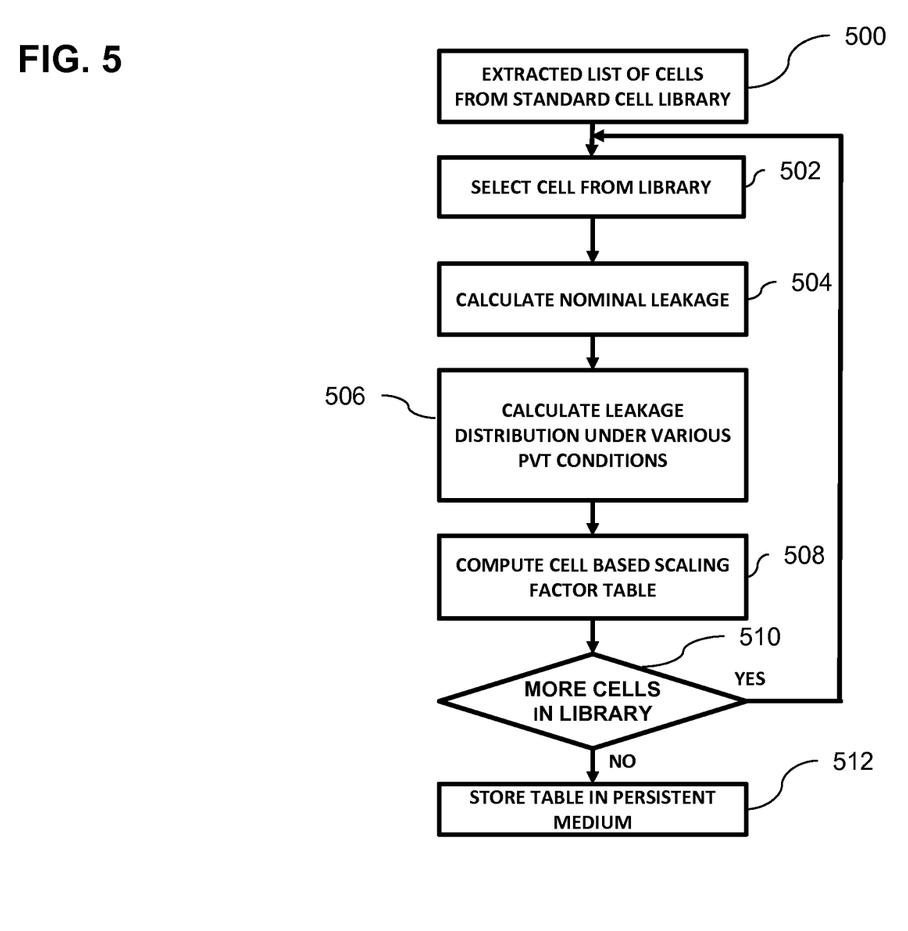
FIG. 5 is a flow chart of a method of populating the tables of FIG. 1.

FIG. 5 is a flow chart of a method of populating the tables 116, 118 of FIG. 1. This procedure is performed before inputting the table in step 200 of FIG. 2.

At step 500 of FIG. 5, a list of standard cells is extracted from a standard cell library.

A loop is performed at steps 502-510 for each standard cell in the library.

At step 502, a cell is selected from the library.

At step 504, a nominal leakage is calculated for the standard cell using a SPICE level model. This nominal leakage corresponds to a nominal set of PVT conditions. In some embodiments, the SPICE level simulation is augmented with Monte Carlo simulation. In alternative embodiments, instead of calculating the nominal leakage, semiconductor devices are fabricated, and test data are collected empirically.

At step 506, leakage values of the standard cell are simulated under a plurality of respectively different process, voltage and temperature variations. In some embodiments, the SPICE level simulation is augmented with Monte Carlo simulation. By using the Monte Carlo method, the distribution of the leakage is also obtained for each cell. In alternative embodiments, instead of calculating the leakage values, semiconductor devices are fabricated, and test data are collected empirically.

At step 508, the simulated leakage values are used to assemble the table 116.

At step 510, if there are additional cells in the library, steps 502-508 are repeated.

At step 512, the table 116 is stored in the persistent storage medium 118, including outputting a list of mean leakage values for each individual standard cell included in the IC design.

FIG. 6 provides pseudocode for a library based scaling factor table. In the embodiment of FIG. 6, the tables 116 and 118 are combined into a single table, table_content.

The operating_voltage and operating_temperature are the nominal voltage and temperature values at which the cells of the library are qualified with nominal values. For example, FIG. 6 represents a table for a library qualified for Vdd=1.2 Volts at 25° C. If the conditions Vdd=1.2 Volts at 25° C. are input, the adjustment factor should provide for zero PVT variation, and only specify an adjustment for the statistical based scaling.

The temperature_index is an M-wise array of temperature values to which the leakage values in the table correspond.

The voltage_index is an N_wise array of voltage values to which the leakage values in the table correspond. The number of elements in the temperature_index may be the same as, or different from, the number of elements in the voltage_index.

The table_content array includes the leakage factors k that are stored in the table. Thus, in the example of FIG. 6, the leakage factor for column temperature_index(M), row voltage_index(N) is stored in table_content(N,M). For a given PVT condition, the mean leakage is given by the following equation:

Statistical mean leakage at user voltage and temperature=nominal leakage*(1+$k$_factor(user temperature, user voltage/nominal voltage))
where user temperature and user voltage are the input PVT conditions.

In FIG. 6, the nominal PVT condition is Vdd=1.2 Volts at 25° C. This condition corresponds to temperature_index(2) and voltage_index(2). The corresponding leakage factor at the second column, third row, is given by 0.2. To determine the mean leakage, the nominal leakage is multiplied by (1+k). This indicates that the mean leakage at Vdd=1.2 Volts at 25° C. is 1.2 times the nominal leakage at the same PVT corner. Thus, the table of FIG. 6 combines the PVT adjustment and statistical adjustment in a single table. In an alternative embodiment, in which the PVT scaling table and statistical scaling table are separate, the PVT scaling factor for the nominal qualification temperature will be zero. For example, if the library is qualified at Vdd=1.2 Volts at 25° C., the k factor at Vdd=1.2 Volts at 25° C. is zero.

To determine a factor k for any temperature and voltage, a 2-D interpolation is performed, interpolating between temperature values and/or interpolating between voltage values.

The table in FIG. 6 corresponds to one process corner, for the entire library. A similar table is provided for each additional process corner of interest. Thus, selecting a process corner implicitly selects the appropriate temperature-voltage scaling table.

To determine total IC leakage using the table of FIG. 6, the total nominal leakage at the nominal operating temperature and voltage for the cells of the IC are summed. The table in FIG. 6 is then used to determine a single adjustment factor that can be applied to the total nominal leakage to provide the total mean IC leakage at the interpolated temperature and voltage.

Figure 7:
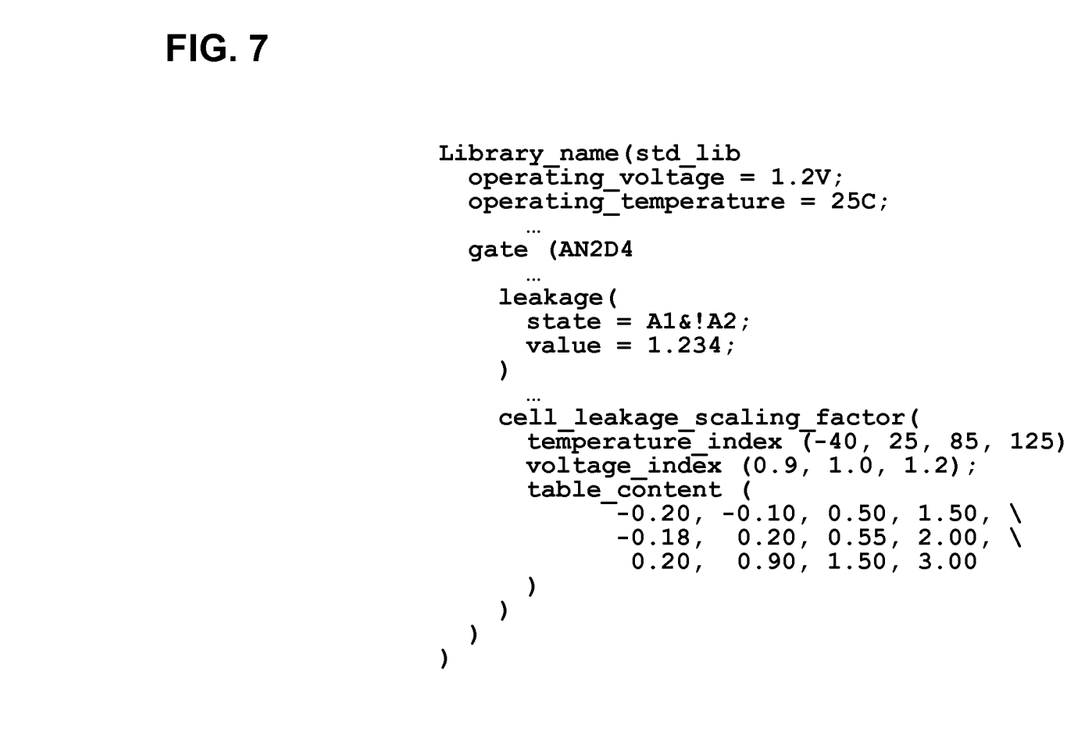
FIG. 7 is an example of a cell-based scaling factor table in accordance with an embodiment of the invention.

FIG. 7 shows pseudocode for a cell based scaling. The basic layout of the table is similar to FIG. 6, except a table as shown in FIG. 7 is provided for each respective cell of the standard cell library.

FIG. 7 is arranged similarly to FIG. 6, and includes an additional declaration of a gate having a leakage state with two input variables (temperature and voltage) and a nominal leakage. ("AN2D4" is an example of a name for a cell).

The table in FIG. 7 corresponds to one process corner, for a single cell. A similar table is provided for each additional process corner of interest for the same cell, to form a set of tables for the one cell. Each respective cell has a respective similar set of tables, including one table for each respective process corner for that respective cell. Thus, selecting a combination of a cell and a process corner implicitly selects the appropriate temperature-voltage scaling table.

To determine total IC leakage using the table of FIG. 7, the nominal cell leakage at the nominal operating temperature and voltage for each cell of the IC is determined. The table in FIG. 7 is then used to determine a single adjustment factor that can be applied to the nominal cell leakage to provide mean cell leakage at the interpolated temperature and voltage. These mean cell leakages are added up to determine the total IC leakage.

In some embodiments, a tool comprises one or more machine readable storage mediums encoded with data representing: a list of a plurality of standard cells included in an integrated circuit (IC) design, a nominal leakage value for each of the plurality of standard cells at a predetermined temperature and voltage, and at least one table including adjustment factors for calculating leakage based on voltage, temperature and process variations. A processor is programmed to calculate and output a total IC leakage for the IC design at an input voltage and input temperature, based on the list, the nominal leakage values, the input voltage, the input temperature and at least one of the adjustment factors.

In some embodiments, a method comprises inputting to a processor a list of a plurality of standard cells included in an integrated circuit (IC) design stored in one or more machine readable storage mediums; inputting to the processor a nominal leakage value for each of the plurality of standard cells at a predetermined temperature and voltage stored in the one or more machine readable storage mediums; accessing, by the processor, at least one table including adjustment factors for calculating leakage based on voltage, temperature and process variations; and calculating within the processor a total IC leakage for the IC design at an input voltage and input temperature, based on the list, the nominal leakage values, the input voltage, the input temperature and at least one of the adjustment factors; and outputting the total IC leakage from the processor.

In some embodiments, a persistent machine readable storage medium is encoded with computer program code, such that when a processor executes the computer program code, the processor performs a method. The method comprises inputting into the processor a list of a plurality of standard cells included in an integrated circuit (IC) design stored in one or more machine readable storage mediums; inputting into the processor a nominal leakage value for each of the plurality of standard cells at a predetermined temperature and voltage stored in the one or more machine readable storage mediums; inputting into the processor at least one table including adjustment factors for calculating leakage based on voltage, temperature and process variations; and calculating within the processor a total IC leakage for the IC design at an input voltage and input temperature, based on the list, the nominal leakage values, the input voltage, the input temperature and at least one of the adjustment factors; and outputting the total IC leakage from the processor.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A tool for calculating leakage of an integrated circuit (IC), comprising:
   one or more machine readable storage mediums encoded with data representing:
   a list of a plurality of standard cells included in an IC design,
   a nominal leakage value approximating a respective median leakage value for each of the plurality of standard cells at a predetermined temperature and voltage, and
   at least one table including adjustment factors for calculating leakage based on voltage, temperature and process variations, the at least one table including a respective statistical scaling factor, for computing a mean leakage from a given median leakage; and
   a processor programmed to calculate and output a total IC leakage for the IC design at an input voltage and input temperature, based on the list, the nominal leakage values, the input voltage, the input temperature and at least one of the adjustment factors.

2. The tool of claim 1, wherein the at least one table includes one or more voltage-temperature scaling tables containing scaling factors for each of a set of temperature-voltage combinations.

3. The tool of claim 2, wherein the one or more voltage-temperature scaling tables include at least two voltage-temperature scaling tables corresponding to respective process corners.

4. The tool of claim 2, wherein the processor performs interpolation between values in one of the voltage-temperature scaling tables for at least one of an intermediate temperature value between temperatures represented in the table and an intermediate voltage value between voltages represented in the table.

5. The tool of claim 2, wherein the at least one table includes a a respective statistical scaling factor for each cell.

6. The tool of claim 2, wherein each adjustment factor includes a component for causing the processor to calculate the total IC leakage using a respective mean leakage corresponding to a respective one of the nominal leakage values for each standard cell.

7. The tool of claim 2, wherein:
   the one or more voltage-temperature scaling tables include at least two voltage-temperature scaling tables corresponding to respective process corners,
   the processor performs interpolation between values in one of the voltage-temperature scaling tables for at least one of an intermediate temperature value between temperatures represented in the table and an intermediate voltage value between voltages represented in the table, and
   the at least one table includes a respective statistical scaling factor for each cell.

8. A method for calculating leakage of an integrated circuit (IC), comprising:
   inputting to a processor a list of a plurality of standard cells included in an integrated circuit (IC) design stored in one or more machine readable storage mediums;
   inputting to the processor a nominal leakage value approximating a respective median leakage value for each of the plurality of standard cells at a predetermined temperature and voltage stored in the one or more machine readable storage mediums;
   accessing, by the processor, at least one table including adjustment factors for calculating leakage based on voltage, temperature and process variations, the at least one table including a respective statistical scaling factor, for computing a mean leakage from a given median leakage; and
   calculating within the processor a total IC leakage for the IC design at an input voltage and input temperature, based on the list, the nominal leakage values, the input voltage, the input temperature and at least one of the adjustment factors; and
   outputting the total IC leakage from the processor.

9. The method of claim 8, wherein the at least one table includes one or more voltage-temperature scaling tables containing scaling factors for each of a set of temperature-voltage combinations.

10. The method of claim 9, wherein the one or more voltage-temperature scaling tables include at least two voltage-temperature scaling tables, each voltage-temperature scaling table corresponding to a respective process corner, and the calculating includes inputting data from a selected one of the one or more voltage-temperature scaling tables into a computation.

11. The method of claim 9, wherein the calculating step performs interpolation between values within one of the voltage-temperature scaling tables for at least one of an intermediate temperature value between temperatures represented in the table and an intermediate voltage value between voltages represented in the table.

12. The method of claim 9, wherein the at least one table further includes a statistical scaling table distinct from the voltage-temperature scaling tables, the statistical scaling table including a respective statistical scaling factor for each cell, and the calculating step includes:
   calculating a nominal leakage value for each cell at a given voltage and temperature based on data from one of the voltage-temperature scaling tables; and
   applying the respective scaling factor to the nominal leakage value for each cell, to calculate a mean leakage value for each cell; and
   summing the mean leakage values for each cell to obtain the total IC leakage.

13. The method of claim 9, wherein each adjustment factor includes a component for causing the processor to calculate the total IC leakage using a respective mean leakage corresponding to a respective one of the nominal leakage values for each standard cell, and the calculating step includes:
   calculating a mean leakage value for each cell at a given voltage and temperature, based on data from one of the voltage-temperature scaling tables; and
   summing the mean leakage values for each cell to obtain the total IC leakage.

14. The method of claim 9, further comprising, before accessing the at least one table, generating the at least one table, including, for each standard cell steps of:
   calculating a nominal leakage for the standard cell using a SPICE level model;

simulating leakage values of the standard cell under a plurality of respectively different process, voltage and temperature variations; and assembling the at least one table so as to include the simulated leakage values; and storing the at least one table in the storage medium.

15. The method of claim 8, further comprising outputting a list of mean leakage values for each individual standard cell included in the IC design.

16. A persistent machine readable storage medium, encoded with computer program code, such that when a processor executes the computer program code, the processor performs a method for calculating leakage of an integrated circuit (IC), comprising:

inputting into the processor a list of a plurality of standard cells included in an IC design stored in one or more machine readable storage mediums;

inputting into the processor a nominal leakage value approximating a respective median leakage value for each of the plurality of standard cells at a predetermined temperature and voltage stored in the one or more machine readable storage mediums;

inputting into the processor at least one table including adjustment factors for calculating leakage based on voltage, temperature and process variations, the at least one table including a respective statistical scaling factor, for computing a mean leakage from a given median leakage; and calculating within the processor a total IC leakage for the IC design at an input voltage and input temperature, based on the list, the nominal leakage values, the input voltage, the input temperature and at least one of the adjustment factors; and outputting the total IC leakage from the processor.

17. The persistent machine readable storage medium of claim 16, wherein the at least one table includes at least two voltage-temperature scaling tables containing scaling factors for respective sets of temperature-voltage combinations, each voltage-temperature scaling table corresponding to a respective process corner, and the calculating step for a given IC design uses a selected one of the voltage-temperature scaling tables.

18. The persistent machine readable storage medium of claim 17, wherein the calculating step performs interpolation between values within one of the voltage-temperature scaling tables for at least one of an intermediate temperature value between temperatures represented in the table and an intermediate voltage value between voltages represented in the table.

19. The persistent machine readable storage medium of claim 17, wherein the at least one table further includes a statistical scaling table distinct from the voltage-temperature scaling tables, the statistical scaling table including a respective statistical scaling factor for each cell, and the calculating step includes:

calculating a nominal leakage value for each cell at a given voltage and temperature based on data from one of the voltage-temperature scaling tables; and applying the respective scaling factor to the nominal leakage value for each cell, to calculate a mean leakage value for each cell; and summing the mean leakage values for each cell to obtain the total IC leakage.

20. The persistent machine readable storage medium of claim 16, wherein each adjustment factor includes a component for causing the processor to calculate the total IC leakage using a respective mean leakage corresponding to a respective one of the nominal leakage values for each standard cell, and the calculating step includes:

calculating a mean leakage value for each cell at a given voltage and temperature based on data from one of the voltage-temperature scaling tables; and summing the mean leakage values for each cell to obtain the total IC leakage.

\* \* \* \* \*